(12) United States Patent
Liu

(10) Patent No.: US 6,980,932 B2
(45) Date of Patent: Dec. 27, 2005

(54) DIGITAL MEASUREMENTS OF SPREAD SPECTRUM CLOCKING

(75) Inventor: Jinlei Liu, Hollister, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 35 days.

(21) Appl. No.: 10/671,414

(22) Filed: Sep. 25, 2003

(65) Prior Publication Data

US 2005/0071132 A1  Mar. 31, 2005

(51) Int. Cl.[7] .................................................. G06F 15/00
(52) U.S. Cl. ..................................... 702/189; 327/158
(58) Field of Search ......................... 702/189, 112, 106; 327/158, 292; 375/150, 367, 350, 316, 146, 375/240.01; 324/536; 332/127; 435/6; 348/473; 714/805

(56) References Cited

U.S. PATENT DOCUMENTS

| | | | | |
|---|---|---|---|---|
| 4,879,729 A | * | 11/1989 | Salembier et al. | 375/350 |
| 5,729,145 A | * | 3/1998 | Blades | 324/536 |
| 6,496,547 B1 | * | 12/2002 | Powell et al. | 375/316 |
| 6,515,553 B1 | * | 2/2003 | Filiol et al. | 332/127 |
| 6,563,892 B1 | * | 5/2003 | Haartsen et al. | 375/350 |
| 6,597,226 B1 | * | 7/2003 | Eade et al. | 327/292 |
| 2002/0176486 A1 | * | 11/2002 | Okubo et al. | 375/146 |
| 2003/0169086 A1 | * | 9/2003 | Lee et al. | 327/158 |

\* cited by examiner

*Primary Examiner*—Michael Nghiem
*Assistant Examiner*—Xiuqin Sun
(74) *Attorney, Agent, or Firm*—Edward L. Miller

(57) ABSTRACT

RF spectrum and FM characteristics of an SSC clock signal are measured with a high speed single-bit test channel that can be present in the Agilent 93000 SOC System. The SSC clock of interest is applied to one of the high-speed single-bit test channels. A conventional FFT is performed on the captured data to discover the aggregate nature of the distributed spectral components, which can then be compared with associated specifications. The captured data is applied to another algorithm to find the FM modulation profile. That algorithm involves operating on captured digital data to perform a frequency translation operation a first filtering operation, a discrete differentiation operation that includes raw phase extraction, followed by a second filtering operation. The algorithm for finding the SSC modulation profile does not require the high-speed digital channel to meet Nyquist sampling requirement.

5 Claims, 3 Drawing Sheets

SPECTRUM BEFORE THE TRANSLATION

SPECTRUM AFTER THE TRANSLATION

DIGITAL MEASUREMENTS OF SPREAD SPECTRUM CLOCKING

BACKGROUND OF THE INVENTION

The FCC in the United States and other regulatory bodies in foreign jurisdictions have become more aggressive in setting performance standards for the radiation of EMI (Electro-Magnetic Interference). Digital equipment that operates according to clock signals, such as computers and their mass storage peripherals, have been identified as a source of EMI. Historically, a virtue of a clock signal was frequency stability; many data transmission systems have crystal controlled clocks. The combination of this frequency stability and the fast edges of the clock and its associated signals combine to produce pronounced collections of harmonics that can be the cause of EMI. For various reasons, it might not be technically or economically feasible to prevent the EMI through shielding. One of the techniques that has been developed to reduce EMI from such systems is to apply spread spectrum techniques to the clock system. SSC (Spread Spectrum Clocking) is a technique where the frequency of the clock signal is made to vary with time in some controlled manner.

For example, there is a Serial ATA standard for hard disc drives that specifies that the clock frequency of 75 MHZ (or 66 MHZ) vary with respect to time downwards and then back up again by one half percent, and at a rate that varies from 30 KHz to 33 KHz. That is, the clock frequency undergoes a varying degree of Frequency Modulation (FM). The idea is to distribute the harmonic content throughout a portion of the spectrum to reduce its power level at any particular frequency.

The FCC and the other regulatory bodies have certification requirements that require the manufacturer to measure the performance of the system to ensure that it meets the regulatory requirements. Items of interest in a system using SSC include the degree of power reduction at certain frequencies (e.g., the nominal clock frequency without FM) and a description of the modulating FM signal itself. Now it is not the case that there is no test equipment available to make such measurements; there is. But the circuitry that needs to be tested often resides on an IC (Integrated Circuit) die that will be tested on a system that is designed to probe, power up, stimulate and test die locations on undiced wafers. They are well suited to the task of ordinary functional testing of digital operation, but do not incorporate the kinds of capabilities found in the type of laboratory grade bench test equipment (flexible counters, fast digital oscilloscopes and full featured spectrum analyzers) that would ordinarily be used to make measurements related to SSC. What is more, it would be electrically troublesome, not to mention expensive, to connect such bench test equipment to a wafer or die. Yet it is most desirable in high volume production situations to test parts as early as possible, so as to avoid the expense of building assemblies with bad parts, since the cost of finding and replacing a bad part goes up rapidly as assembly fabrication proceeds. The parts we are interested in do get otherwise tested by a digital IC tester such as the Agilent 93000 SOC System (SOC stands for System On a Chip). However, depending upon how any particular such system is configured, the tester might not be equipped with the hardware needed to perform measurements of RF spectrum and FM characteristics. The Agilent 93000 SOC System can indeed be equipped with such measurement hardware, but to do so involves a certain expense. Such an expense might be viewed as a lamentable inefficiency if it were incurred only for the measurement of parameters related to SSC. It would desirable if there were a way that the measurement capabilities of the Agilent 93000 SOC System, and of other similar systems, could be easily and at a low cost, extended to measure the spectrum, deviation and rates of deviation for an SSC operated system. What to do?

SUMMARY OF THE INVENTION

A solution to the problem of measuring the RF spectrum, and FM characteristics of the clock signal in an SSC operated system is to take advantage of one of the one or more high speed single-bit test channels that can be present in the Agilent 93000 SOC System. Such a channel can be configured to measure, at up to 2.5 Gbps, the logical value of an input signal applied thereto. The SSC signal of interest is applied to one of the high-speed single-bit test channels. A conventional FFT (Fast Fourier Transform) is performed on the captured data to discover the aggregate nature of the distributed spectral components, which can then be compared with associated specifications. The captured data is applied to another algorithm to find the FM modulation profile. That algorithm involves operating on captured digital data to perform a frequency translation operation (equivalent to heterodyning), a first filtering operation, a discrete differentiation operation and raw phase extraction that includes a summation of two components and a root square operation, finally followed by a second filtering operation to produce an FM modulation profile. The algorithm for finding the SSC modulation profile does not require the high-speed digital channel to meet Nyquist sampling requirements.

DESCRIPTION OF A PREFERRED EMBODIMENT

Figure 1:
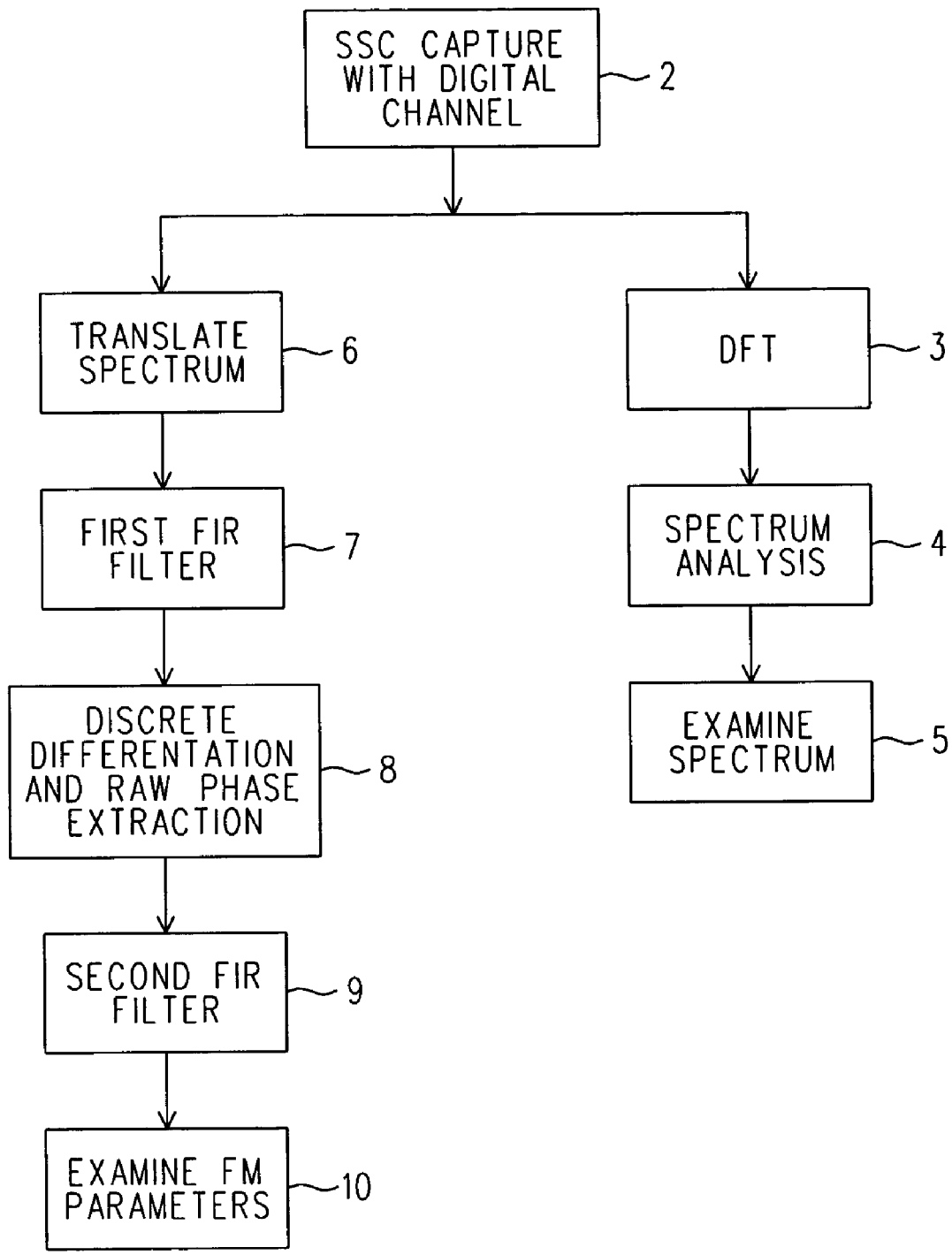
FIG. 1 is a simplified flow chart of how SSC measurements are made in accordance with an aspect of the invention.

Refer now to FIG. 1, wherein is shown a simplified flow chart 1 that includes an algorithm for obtaining the FM parameters of an SSC signal from captured digital data that does not necessarily meet Nyquist criteria. The first step 2 in the flow chart 1 is the capture of the SSC data using the "digital channel" capability of the Agilent 93000 SOC System. In this type of measurement an SSC signal is applied to a comparator having a threshold and the logical results of TRUE and FALSE appear as a stream of digital data at that matches the SSC signal. A digital "1" will represent TRUE and a digital "0" will represent a FALSE. The threshold for the comparator is set at about the midpoint of the total expected excursion of the SSC signal. At some regular and pre-determined rate the digital values in this single bit stream are captured in a array in memory. The rate of capture will not be synchronous with the SSC signal, but will instead be at a regular and steady rate determined by the sampling mechanism in the digital channel of the tester.

Logic State Analyzer and Timing Analyzer hardware come to mind as representative of the sort of data capture hardware being described here. Now, if the data capture were synchronous with the SSC signal, then the captured data would lose its time reference and also its SSC (FM) character. However, a steady rate of capture that is at least as fast as the fastest clock rate (which we shall call $\omega_0$) is guaranteed to preserve the underlying FM properties, even though the captured data may from time to time be "missing" a bit. That is, the regular nature of sampling may, at rates lower than twice the highest SSC signal rate, occasionally fail to register a transition. The result is that a string of consecutive 1's might be missing a 0, or a string of consecutive 0's might be missing a 1. The algorithm that we will disclose for recovering the FM modulation profile tolerates this minor wart, and produces the correct answer, anyway. These measured 1's and 0's are held in a first measurement array.

It will further be appreciated that, since the algorithm begins with a threshold operation, the signal whose FM profile is to be measured might be a sinusoidal FM signal having equal plus and minus peak excursions about ground, rather than a digital signal referenced to ground. In such a sinusoidal case, the threshold would be, say, greater than or equal to zero volts. Furthermore, the modulating signal (i.e., the signal whose modulation profile is of interest) need not be sinusoidal; it might, for example, be triangular, or even something else, such a as a saw tooth. Also, and in either case, it is desirable to capture at least three to five cycles of the SSC signal, to allow for settling of certain filtering steps to be described in due course.

To continue, then, if base band and harmonic spectrum information are desired, then the captured data is (at 3) operated upon with a suitable (and conventional) DFT (Discrete Fourier Transform) process, whereupon the results can be analyzed and classified (at 4), after which the spectrum data can be examined and compared to specified limits (5). This right-hand fork of the flow chart 1 may require that the capture rate of the digital channel meet certain Nyquist criteria.

Our main interest is in the left-hand fork of the flow chart 1. Here there are shown a series of steps 6–10 that operate on captured SSC data acquired back at the first step (2). The captured data might be the same data that was used by the right-hand branch of the flow chart, or it might be a data from a separate instance of data acquisition to supply data in the first measurement array.

Figure 2A:
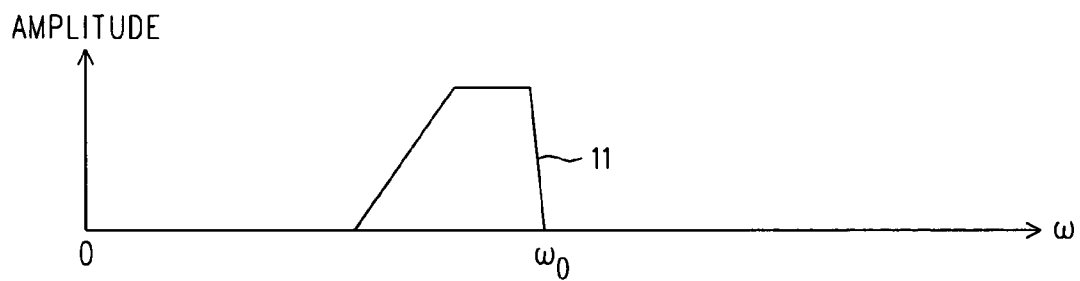
FIGS. 2A and 2B are spectrum diagrams useful in appreciating the operation of the simplified flow chart of FIG. 1.
Figure 2B:
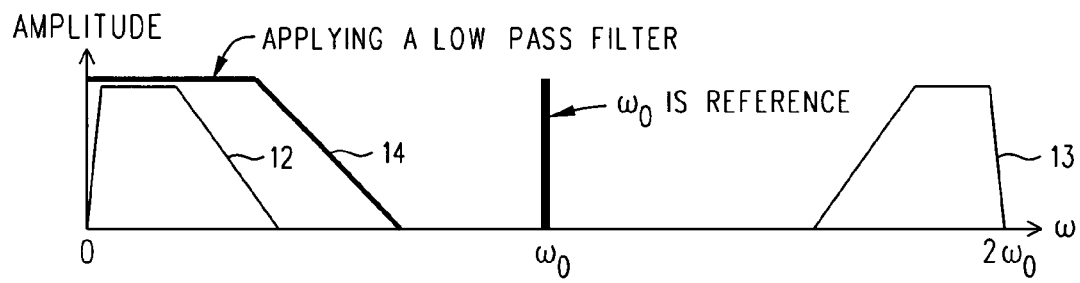

At this point the reader should refer simultaneously to FIGS. 1, 2A and 2B. As shown in FIG. 2A, the SSC signal under consideration has a certain spectrum 11 (we have not attempted to indicate any harmonics—just the base band, or fundamental, spectrum itself). It is the FM modulation profile of that spectrum 11 that we wish to measure. The TRANSLATE SPECTRUM step (6) of the flow chart 1 is a software implementation of a heterodyne operation that produces upper and lower side bands (12 and 14, respectively in FIG. 2B) that are not only displaced from $\omega_0$, but that are also reflected (or reversed in "direction"). In order to perform this computation we employ the expedient of taking a logical 1 to represent the number one, and taking a logical 0 to represent a the number zero. It will be appreciated that the modulation profile of the sidebands is, save for the reflection, the same as for the original spectrum 11. The TRANSLATE SPECTRUM step (6) operates on the first measurement array and produces in a second translation array a (numerical) string of plus or minus ones and zeros that represents the superposition of the two side bands.

The next step (7) in the algorithm is the application to the data in the second translation array of a FIRST FIR (Finite Impulse Response) FILTER. Its purpose is to act as a low pass filter that removes the upper side band. The output of the FIRST FIR FILTER is a third array that would normally have both original sine and original cosine sections that are populated with fractional values for each sample, save that the values of the cosine terms in the cosine section will be all zeros, and need not actually exist as memory having those zero values. (The absence of any non-zero cosine terms arises from setting the sampling threshold at the mid-point of the excursion of the SSC signal, and at a rate we shall call $\omega_0$ in FIGS. 2A and 2B. The computations of the FIRST FIR FILTER may be simplified to reflect this fact. If the sampling were accomplished at twice that rate then there would be two interleaved original sequences of sine and non-zero cosine data. That is, if sampling were done at a rate of $2\omega_0$, then the result would be construed as two interleaved sections that were each sampled at $\omega_0$ and that are separated in phase by 90°. What is of note is that the algorithm shown below still works if the data is sampled at just ($\omega_0$.)

Following the FIRST FIR FILTER step (7) is a DISCRETE DIFFERENTIATION AND RAW PHASE EXTRACTION STEP (8). The discrete differentiation takes the differences between successive original sine terms in the third array to operationally discover the rate of change of those original sine terms, which is, as is well known, cosine information. If the original cosine terms are not zero, then the same discrete differentiation is also performed for the original cosine terms to find derived sine terms, although this step may be omitted if the original cosine terms are zeros. The original sine terms and their derived cosine terms, and the original (and assumed-to-be-zero) cosine terms and their derived sine terms can all be combined to find phase information, as shown below. The change in the phase ($\Delta\varphi(t)$) can then be used to further find the change in frequency ($\Delta\omega(t)$), also as shown below. It is, of course, the change in frequency that describes the FM modulation profile.

$$S_1(t) = \frac{1}{2}\sin\Delta\varphi(t)$$

$$S_2(t) = \frac{1}{2}\cos\Delta\varphi(t)$$

$$\frac{dS_1(t)}{dt} = \frac{1}{2}\frac{d\sin\Delta\varphi(t)}{dt} = \frac{1}{2}\frac{d\Delta\varphi(t)}{dt}\cos\Delta\varphi(t)$$

$$\frac{dS_2(t)}{dt} = \frac{1}{2}\frac{d\cos\Delta\varphi(t)}{dt} = -\frac{1}{2}\frac{d\Delta\varphi(t)}{dt}\sin\Delta\varphi(t)$$

$$\frac{d\Delta\varphi(t)}{dt} = \Delta\omega(t)$$

$$\cos^2\Delta\varphi(t) + \sin^2\Delta\varphi(t) = 1$$

Therefore $$\left(\frac{dS_1(t)}{dt}\right)^2 + \left(\frac{dS_2(t)}{dt}\right)^2 = \frac{1}{4}(\Delta\omega(t))^2 \rightarrow \frac{1}{2}\sqrt{(\Delta\omega(t))^2} = \frac{1}{2}|\Delta\omega(t)|$$

Figure 3A:
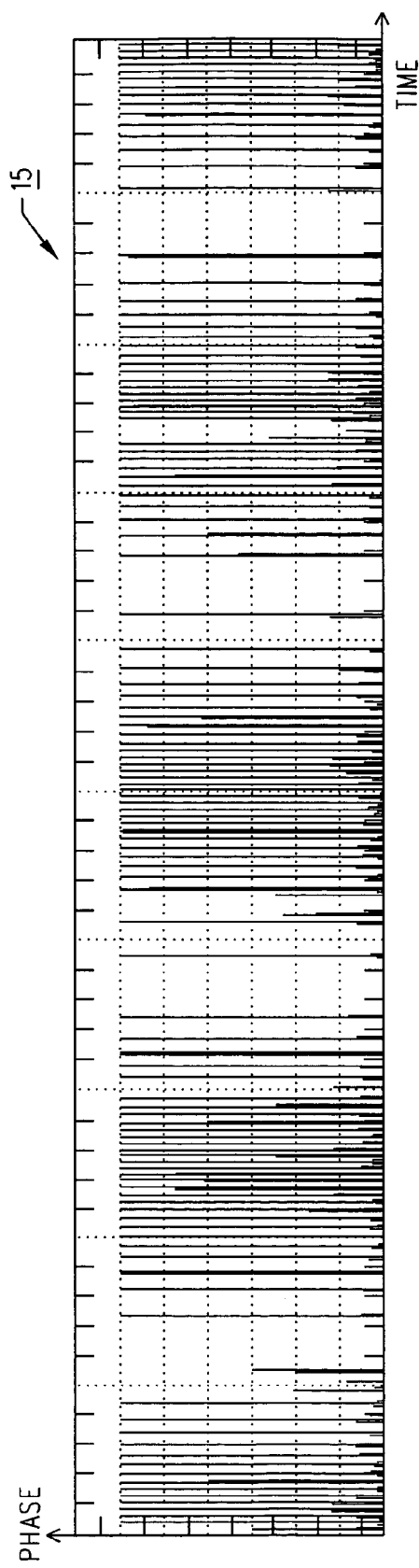
FIGS. 3A and 3B are respective phase and frequency diagrams illustrating the recovery of an FM modulation profile from an SSC signal that has been processed to extract phase changes as a function of time.
Figure 3B:
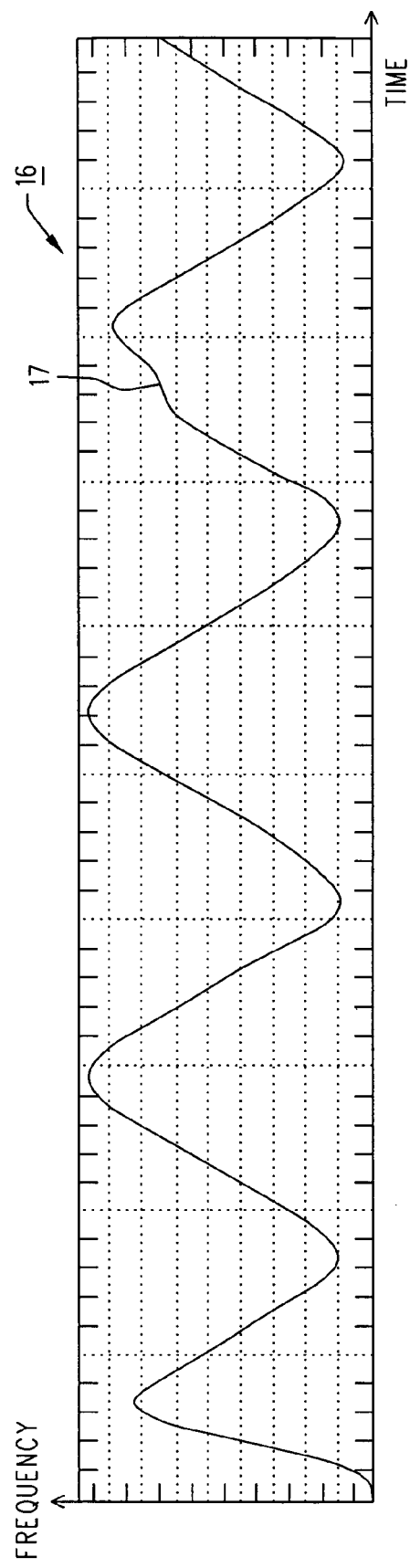

The next step is a SECOND FIR FILTER (9). This accepts a fourth array of consecutive $\Delta\omega(t)$ values from step (8) and smooths it to become a fifth array of consecutive values that represent the FM modulation profile. An example of what such data is like is shown in the graph 15 of FIG. 3A. The filtered result is not necessarily perfect, a typical graph 16 of which is shown in FIG. 3B; location 17 is a minor imperfection that arises from nature of the binary sampling technique, and might be ameliorated by sampling at a higher rate or by more stringent filtering. Note also that the SECOND FIR FILTER needs some time to settle (i.e., note that the extreme left-hand edge of the graph is misshapen). This is a principle reason why the CAPTURE step (2) ought to acquire three to five cycles of the SSC signal. It will be appreciated that the recovery of different modulation profiles for the SSC signal might benefit from corresponding adjustments to, or changes to the nature of, the SECOND FIR FILTER.

The following APPENDIX is pseudo code (essentially a complete C++ program) that implements the steps of the left-hand fork of the flow chart of FIG. 1. In one embodiment this program executes on the Agilent 93000 SOC System. It is well commented and is believed to be, in light of the foregoing Specification, self-explanatory to those who are skilled in the C++ programming language and also in the basics of digital signal processing techniques, such as the Discrete Fourier Transform. The line numbers that appear to the left of the listing are not part of the program and have appended merely to facilitate references in this Specification to locations in the text of the APPENDIX.

In particular:

Lines 20–56 correspond to step (2) of the flow char of FIG. 1;

Lines 57–72 correspond to step (6) of the flow char of FIG. 1;

Lines 73–93 correspond to step (7) of the flow char of FIG. 1;

Lines 94–123 correspond to step (8) of the flow char of FIG. 1;

Lines 124–137 correspond to step (9) of the flow char of FIG. 1;

Lines 138–165 correspond to step (10) of the flow char of FIG. 1; and

Lines 166–220 are a subroutine for the FIR filters of steps (7) and (9).

APPENDIX

```
1  //-----------------------------------------------------------------
2  //- DESCRIPTION:
3  //-
4  //- This pseudo code (which is almost a complete C++ program) shows
5  //- the extraction of SSC frequency modulation information based on
6  //- captured single bit digital data which might look like, for
7  //- example: 10101010101000101010101011011010101010101010 .
8  //-
9  //- This example routine executes on an Agilent 93000SOC ATE
10 //- system. It captures data on a single pin under consideration,
11 //- which will be the SSC output pin or transmitter pin which
12 //- outputs·an SSC signal at high speed. It uses a standard
13 //- subroutine call available in Agilent93000SOC SW, through which
14 //- captured data will be retrieved into the workstation.
15 //- Subsequently, this algorithm will begin to operate on this
16 //- captured single bit digital data to extract frequency
17 //- modulation parameters.
18 //-
19 //-----------------------------------------------------------
20 //-----------------------------------------------------------
21 //- A) Digital capture test:
22 //-
23 //- A.1)
24 //- First an array variable Captured_Data of type ARRAY_D
25 //- is defined. ARRAY_D's an one-dimensional array data of
26 //- DOUBLE type. The system automatically allocates memory
27 //- by the number of elements assigned to "Captured_Data".
28 //- The number of array elements is checked and is automatically
29 //- resized if necessary.
30 //-
31 //- A.2)
32 //- DIGITAL_CAPTURE_TEST( ) is a standard API ( Application
33 //- Program Interface) call of 93000 SOC SW to run the test in the
34 //- digital capture mode, and capture data on the specified
35 //- digital pin for SSC clocking. The captured data is saved in
36 //- a memory associated with the pin ("tester pin channel memory').
37 //-
38 //- A.3)
39 //- Retrieve data from the vector memory
40 //- VECTOR("VectorVariable").getVectors(NumberSamples) is
41 //- another standard API call for retrieving data from the
42 //- tester pin channel memory back into the array variable
43 //- "Capture_Data" defined before.
44 //- "VectorVariable" is data in tester pin channel memory
45 //- associated with the SSC signal pin, and
46 //- "NumberSamples" is the number of samples specified.
47 //-----------------------------------------------------------
48   ARRAR_D Capture_Data;
49   DIGITAL_CAPTURE_TEST( );
50   Capture_Data=VECTOR(VectorVariable).getVectors(NumberSamples);
51 //-----------------------------------------------------------
52 //- A.4)
53 //- Put the captured data to graphic window for checking.
54 //- PUT_DEBUG is an standard API to perform this task.
```

APPENDIX-continued

```
 55  //------------------------------------------------------------
 56    PUT_DEBUG("Pin","RawData",Capture_Data);
 57  //------------------------------------------------------------
 58  //- B) Spectrum Translation with sin:
 59  //-
 60  //- Only sin data will be calculated, since all cos data is
 61  //- is equal to zero.
 62  //------------------------------------------------------------
 63    ARRAY_D AutoWSin,AutoWCos;
 64    cap_size=Capture_Data.size( );
 65    AutoWSin.resize(cap_size);
 66    AutoWCos.resize(cap_size);
 67    INT loopcount,cap_size;
 68    for (loopcount=0;loopcount<cap_size;loopcount+=2)
 69    {
 70         AutoWSin[loopcount]=Capture_Data[loopcount]/2;
 71         AutoWSin[loopcount+1]=−Capture_Data[loopcount+1]/2;
 72    }
 73  //------------------------------------------------------------
 74  //- C) First FIR Filtering:
 75  //-
 76  //- C.1)
 77  //- First FIR generation:
 78  //- dsp_LPF_FIR is a subroutine for creating coefficients
 79  //- of a finite impulse response filter.
 80  //-
 81  //- C.2)
 82  //- Applying this filter to data:
 83  //- DSP_CONVOL is a standard API call to perform convolution
 84  //- operation of two arrays and result is saved in FIRWSin
 85  //- and FIRWCos. FIRWCos in fact are all zero.
 86  //------------------------------------------------------------
 87    INT Nfir=1024;
 88    DOUBLE dLPBW=0.05;
 89    ARRAY_D dFIR;
 90    dsp_LPF_FIR(Nfir,dLPBW,dFIR);
 91    ARRAY_D FIRWSin,FIRWCos;
 92    DSP_CONVOL(dFIR,AutoWSin,FIRWSin);
 93    DSP_CONVOL(dFIR,AutoWCos,FIRWCos);
 94  //------------------------------------------------------------
 95  //- D) Discrete Differentiation and Raw Phase Extraction
 96  //-
 97  //- D.1) Discrete Differentiation based on FIRWSin(i)−FIRWS(i−1)
 98  //-      and FIRWCos(i)−FIRWCos(i−1) where FIRWSin and FIRWCos
 99  //-      are the sinusoidal and cosinusoidal components of the
100  //-      data array from the first FIR filter result.
101  //-
102  //- D.2) Squaring of each differentiation result
103  //-
104  //- D.3) Summation of these two squaring results and root
105  //-      squaring afterwards
106  //------------------------------------------------------------
107    ARRAY_D SSC_Value(Capture_Data.size( ));
108    DOUBLE Tmp_Value;
109    for (count=0;count<points;count++)
110    {
111         if (count==0)
112         {
113              SSC_Value[count]=0.0;
114         }
115         else
116         {
117  Tmp_Value=(FIRWSin[count]−FIRWSin[count−1])*(FIRWSin[count]−FIRWSin
118  [count−1]);
119  Tmp_Value+=(FIRWCos[count]−FIRWCos[count−1])*(FIRWCos[count]−FIRWCos
120  [count−1]);
121              SSC_Value[count]=sqrt(Tmp_Value)/Step/2/M_PI*2;
122         }
123    }
124  //------------------------------------------------------------
125  //- E) Second FIR Filter:
126  //-
127  //- E.1)
128  //-Second FIR Generation:
129  //-
130  //- E.2)
131  //- Filtering with the second FIR filter.
132  //- After the filtering the desired FM parameters are present.
133  //------------------------------------------------------------
```

APPENDIX-continued

```
134  ARRAY_D SSC_Demod;
135  dLPBW=0.000005;
136  dsp_LPF_FIR(Nfir,dLPBW,dFIR);
137  DSP_CONVOL(dFIR,SSC_Value,SSC_Demod);
138  //-----------------------------------------------------------
139  //- F) Analysis of the result
140  //-
141  //- Find the frequency data from the changing phase data. Find
142  //- the minimum and maximum values of the frequency modulation.
143  //-----------------------------------------------------------
144  //-----------------------------------------------------------
145  //- DSP_MINMAX is a standard API call of 93000 SOC SW
146  //- to find the min and max value in an array. The variables
147  //- min and max are proportional to the min and max frequency.
148  //-----------------------------------------------------------
149  DOUBLE min,max;
150  DSP_MINMAX(SSC_Demod,&min,&max);
151  //-----------------------------------------------------------
152  //- DSP_EDGE is a standard API call of 93000 SOC SW
153  //- to find the element location of rise/fall in an array
154  //- with specified threshold.
155  //- First find edge1 at 50% threshold and then find the next
156  //- edge2 at 50% threshold. The difference is then between
157  //- edge2 and edge1 and result is saved in period.
158  //-----------------------------------------------------------
159  DOUBLE edge1,edge2;
160  DOUBLE period;
161  int start;
162  start=1000;
163  DSP_EDGE(SSC_Demod, &edge1, start, 0.5*(max-min)+min; RISE);
164  DSP_EDGE(SSC_Demod, &edge2, edge1, 0.5*(max-min)+min; RISE);
165  period=edge2-edge1;
166  //-----------------------------------------------------------
167  // End of the main routine.
168  //-----------------------------------------------------------
169  //-----------------------------------------------------------
170  // Subroutine for finite impulse response filter coefficients:
171  //-----------------------------------------------------------
172  void dsp_LPF_FIR(
173    INT            Nfir,   /* Length of FIR                       */
174    DOUBLE         dBW,    /* Pass band width of LPF (1.0 = Fdgt) */
175    ARRAY_D &      dFIR    /* LPF FIR array data                  */
176  )
177  {
178    INT                  i,Nsp,Nc,Ncycles;
179    ARRAY_COMPLEX        CSp,CWave;
180    ARRAY_D              dWave1,dWave2;
181    ARRAY_D              dSp1,dSp2;
182    DOUBLE               dX,dNc,dP;
183    dNc=Nfir*dBW;        /* Passband Ratio (relative to dFdgt) /
184    Nc=(int)(dNc+0.5);
185    Nsp=Nfir/2;
186    CSp.resize(Nfir);
187    for (i=0;i<=Nc;i++)
188    {
189        CSp[i].real( )=1.0;
190        CSp[i].imag( )=0.0;
191    }
192    for (i=Nc+1;i<=Nsp;i++)
193    {
194        CSp[i].real( )=0.0;
195        CSp[i].imag( )=0.0;
196    }
197    for (i=1;i<Nsp;i++)
198    {
199        CSp[Nfir-i].real( )= CSp[i].real( );
200        CSp[Nfir-i].imag( )=-CSp[i].imag( );
201    }
202    DSP_IFFT(CSp,CWave);
203    dFIR.resize(Nfir);
204    for (i=0;i<Nfir;i++) dFIR[i]=0.5*CWave[i].real( );
205    for (i=0;i<Nsp;i++)
206    {
207        dX=dFIR[i];
208        dFIR[i]=dFIR[Nsp+i];
209        dFIR[Nsp+i]=dX;
210    }
211    /* Hanning weighting onto the FIR */
212    for (i=0;i<Nfir;i++)
```

APPENDIX-continued

```
213  {
214      dX=0.5*(1.0-cos(2.0*M_PI*(double)i/(double)(Nfir-1)));
215      dFIR[i]=dFIR[i]*dX;
216  }
217  /* Scaling */
218  dX=0.0; for (i=0;i<Nfir;i++) dX=dX+dFIR[i];
219  DSP_MUL_SCL(1.0/dX,dFIR,dFIR);
220  }
```

I claim:

1. A method of measuring the FM profile of a work signal, the method comprising the steps of:
   (a) comparing, at a regular rate of at least once per cycle of the work signal, the work signal against a threshold to produce a first sequence of logical values whose transitions from one logical value to another correspond to half the period of the work signal, the threshold being set at essentially the midpoint of the work signal's excursion;
   (b) storing the first sequence of logical values;
   (c) computationally heterodyning the signal represented by the first sequence of logical values stored in step (b) by construing those logical values as corresponding numeric ones and zeros and producing a second sequence of numeric values that represents a spectrum including upper and lower sidebands, the lower sideband approaching but not passing through a frequency of zero;
   (d) digitally filtering the second sequence of numeric values to remove the upper sideband and produce a third sequence of numerical values including consecutive time variant original sine values of the lower sideband;
   (e) differentiating the consecutive time variant original sine values of the third sequence to form a fourth sequence of derived cosine values whose successive members are the differences between each original sine value of the third sequence and its successor original sine value in the third sequence;
   (f) assuming the existence of an all-zero fifth sequence of original cosine values corresponding to the original sine values of the third sequence, and also the existence of an all-zero sixth sequence of derived sine values corresponding to the fourth sequence of derived cosine values;
   (g) computationally extracting phase information from the third, fourth, fifth and sixth sequences to produce a seventh sequence of numerical values representing change in phase as a function of time;
   (h) digitally filtering the seventh sequence to produce an eighth sequence of numerical values representing change in frequency as a function of time; and
   (i) inspecting the numerical values in the eighth sequence to ascertain the minimum and maximum frequencies.

2. A method as in claim 1 wherein the work signal is a spread spectrum clock signal.

3. A method as in claim 1 wherein the regular rate of step (a) is less than the Nyquist sampling rate for the work signal.

4. A method of measuring the FM profile of a work signal, the method comprising the steps of:
   (a) comparing, at a regular rate of at least twice per cycle of the work signal, the work signal against a threshold to produce a first sequence of logical values whose transitions from one logical value to another correspond to half the period of the work signal, the threshold being set at essentially the midpoint of the work signal's excursion;
   (b) storing the first sequence of logical values;
   (c) computationally heterodyning the signal represented by the first sequence of logical values stored in step (b) by construing those logical values as corresponding ones and zeros and producing a second sequence of numeric values that represents a spectrum including upper and lower sidebands, the lower sideband approaching but not passing through a frequency of zero;
   (d) digitally filtering the second sequence of logical values to remove the upper sideband and produce a third sequence of numerical values of consecutive time variant original sine values and a fifth sequence of numerical values of consecutive time variant original cosine values, each for the lower sideband;
   (e) differentiating the consecutive time variant original sine values of the third sequence to form a fourth sequence of derived cosine values whose successive members are the differences between each original sine value of the third sequence and its successor original sine value in the third sequence;
   (f) differentiating the consecutive time variant original sine values of the fifth sequence to form a sixth sequence of derived sine values whose successive members are the differences between each original cosine value of the fifth sequence and its successor original cosine value in the fifth sequence;
   (g) computationally extracting phase information from the third, fourth, fifth and sixth sequences to produce a seventh sequence of numerical values representing change in phase as a function of time;
   (h) digitally filtering the seventh sequence to produce an eighth sequence of numerical values representing change in frequency as a function of time; and
   (i) inspecting the numerical values in the eighth sequence to ascertain the minimum and maximum frequencies.

5. A method as in claim 4 wherein the work signal is a spread spectrum clock signal.

* * * * *